(12) United States Patent
Miyata (10) Patent No.: US 11,651,997 B2
(45) Date of Patent: May 16, 2023

(54) RECOGNITION METHOD OF KERF

(71) Applicant: DISCO CORPORATION, Tokyo (JP)

(72) Inventor: Satoshi Miyata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 327 days.

(21) Appl. No.: 17/004,463

(22) Filed: Aug. 27, 2020

(65) Prior Publication Data

US 2021/0066129 A1    Mar. 4, 2021

(30) Foreign Application Priority Data

Sep. 2, 2019 (JP) .............................. JP2019-159906

(51) Int. Cl.
*H01L 21/78* (2006.01)
*H01L 21/68* (2006.01)
*H01L 21/683* (2006.01)

(52) U.S. Cl.
CPC .............. *H01L 21/78* (2013.01); *H01L 21/68* (2013.01); *H01L 21/6836* (2013.01)

(58) Field of Classification Search
None
See application file for complete search history.

(56) References Cited

U.S. PATENT DOCUMENTS

| | | | |
|---|---|---|---|
| 6,192,289 B1 * | 2/2001 | Geffen | G06T 7/0004 700/121 |
| 2016/0284611 A1 * | 9/2016 | Sekiya | H01L 21/78 |
| 2019/0067108 A1 * | 2/2019 | Tanaka | B23K 26/043 |
| 2019/0229005 A1 * | 7/2019 | Tanaka | H01L 21/78 |
| 2019/0271962 A1 * | 9/2019 | Miyata | G05B 19/41875 |
| 2020/0227319 A1 * | 7/2020 | Yamamoto | H01L 21/78 |

FOREIGN PATENT DOCUMENTS

| | | | |
|---|---|---|---|
| JP | 2005311033 A | | 11/2005 |
| JP | 2014220445 A | * | 11/2014 |
| JP | 2017098567 A | * | 6/2017 |
| JP | 2019067862 A | * | 4/2019 |

OTHER PUBLICATIONS

Machine translation of JP-2014220445-A (Year: 2014).*
Machine translation of JP-2017098567-A (Year: 2017).*
Machine translation of JP-2019067862-A (Year: 2019).*

* cited by examiner

*Primary Examiner* — Erik T. K. Peterson
(74) *Attorney, Agent, or Firm* — Greer Burns & Crain Ltd.

(57) ABSTRACT

A recognition method of a kerf includes a bonding step of bonding a workpiece to a dicing tape greater in size than the workpiece, a pre-machining imaging step of imaging an optimal region of the dicing tape where the workpiece is not bonded, a kerf forming step of forming a kerf in the optimal region by a cutting machine, a post-machining imaging step of imaging the optimal region with the kerf formed therein, and a recognition step of comparing intensities of light received at each two corresponding pixels in respective images of the optimal region as acquired by the pre-machining imaging step and the post-machining imaging step, subtracting the each two pixels where intensities of received light are the same, and recognizing as the kerf a region formed by the remaining pixels.

3 Claims, 12 Drawing Sheets

RECOGNITION METHOD OF KERF

BACKGROUND OF THE INVENTION

Field of the Invention

The present invention relates to a recognition method of a kerf.

Description of the Related Art

A cutting machine that cuts a workpiece into individual device chips by a cutting blade needs, for example, after a replacement of the cutting blade, to form a cut groove, in other words, a kerf in a region other than a region where devices are formed, and to correct the position of the cutting blade such that a reference line stored beforehand in the cutting machine and the position of the actually formed kerf are aligned with each other. This correction operation of the position of the cutting blade based on the reference line and the position of the kerf is called "hairline alignment" (see, for example, JP 2005-311033 A).

SUMMARY OF THE INVENTION

When performing this hairline alignment, it is a common practice to first form the kerf in a surplus region of the workpiece where no devices are formed. If the position of the kerf is substantially deviated from the reference line, however, the kerf may be formed in a device region where devices are formed. As in JP 2005-311033 A, hairline alignment may therefore be performed by causing a cutting blade to cut into a dicing tape in a region thereof, where a workpiece is not bonded, to form a kerf, performing coarse alignment between a reference line and the kerf so formed, and then forming another kerf in a surplus region of the workpiece.

However, the dicing tape includes an adhesive layer on a base material layer, so that when imaged, the dicing tape looks as if bearing a sparse pattern. Accordingly, the dicing tape involves a problem that a kerf can hardly be recognized accurately through image processing due to an interference by the pattern of the dicing tape itself.

The present invention therefore has as an object thereof the provision of a recognition method of a kerf formed on a dicing tape, which enables to recognize the kerf with ease.

In accordance with an aspect of the present invention, there is provided a recognition method of a kerf, including: a bonding step of bonding a workpiece to a dicing tape greater in size than the workpiece; a pre-machining imaging step of imaging an optimal region of the dicing tape where the workpiece is not bonded; a kerf forming step of forming a kerf in the optimal region by a cutting machine; a post-machining imaging step of imaging the optimal region with the kerf formed therein; and a recognition step of comparing intensities of light received at each two corresponding pixels in respective images of the optimal region as acquired by the pre-machining imaging step and the post-machining imaging step, subtracting the each two pixels where intensities of received light are the same, and recognizing as the kerf a region formed by the remaining pixels.

Preferably, the recognition method of a kerf may further include an optimal region determination step of determining the optimal region. The optimal region determination step may image a plurality of regions of the dicing tape where the workpiece is not bonded, and determine as the optimal region one of the regions in the images, the one region having pixels where intensities of received light have smallest dispersion.

Preferably, the recognition method of a kerf may further include a positional deviation detecting step of detecting, based on the kerf recognized in the recognition step, a positional deviation between a position planned to be machined, which is beforehand stored in the cutting machine, and the formed kerf. The pre-machining imaging step and the post-machining imaging step may each be performed under plural kinds of light quantity conditions. The recognition step may recognize a shape of the kerf under every one of the plural kinds of light quantity conditions adopted in the pre-machining imaging step and the post-machining imaging step. The positional deviation detecting step may evaluate, in accordance with desired evaluation standards, shapes of kerfs recognized under the respective light quantity conditions in the recognition step, and detect the positional deviation based on the kerf the shape of which has been evaluated to have a highest evaluation score.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the drawings, a description will hereinafter be made in detail regarding an embodiment of the present invention. However, the present invention should not be limited by details that will be described in the following embodiment. The constituent components that will hereinafter be described include those readily conceivable to persons skilled in the art and substantially the same ones. Further, the configurations that will hereinafter be described can be combined appropriately. Furthermore, various omissions, replacements, and modifications of configurations can be made in a range not departing from the spirit of the present invention.

Figure 1:
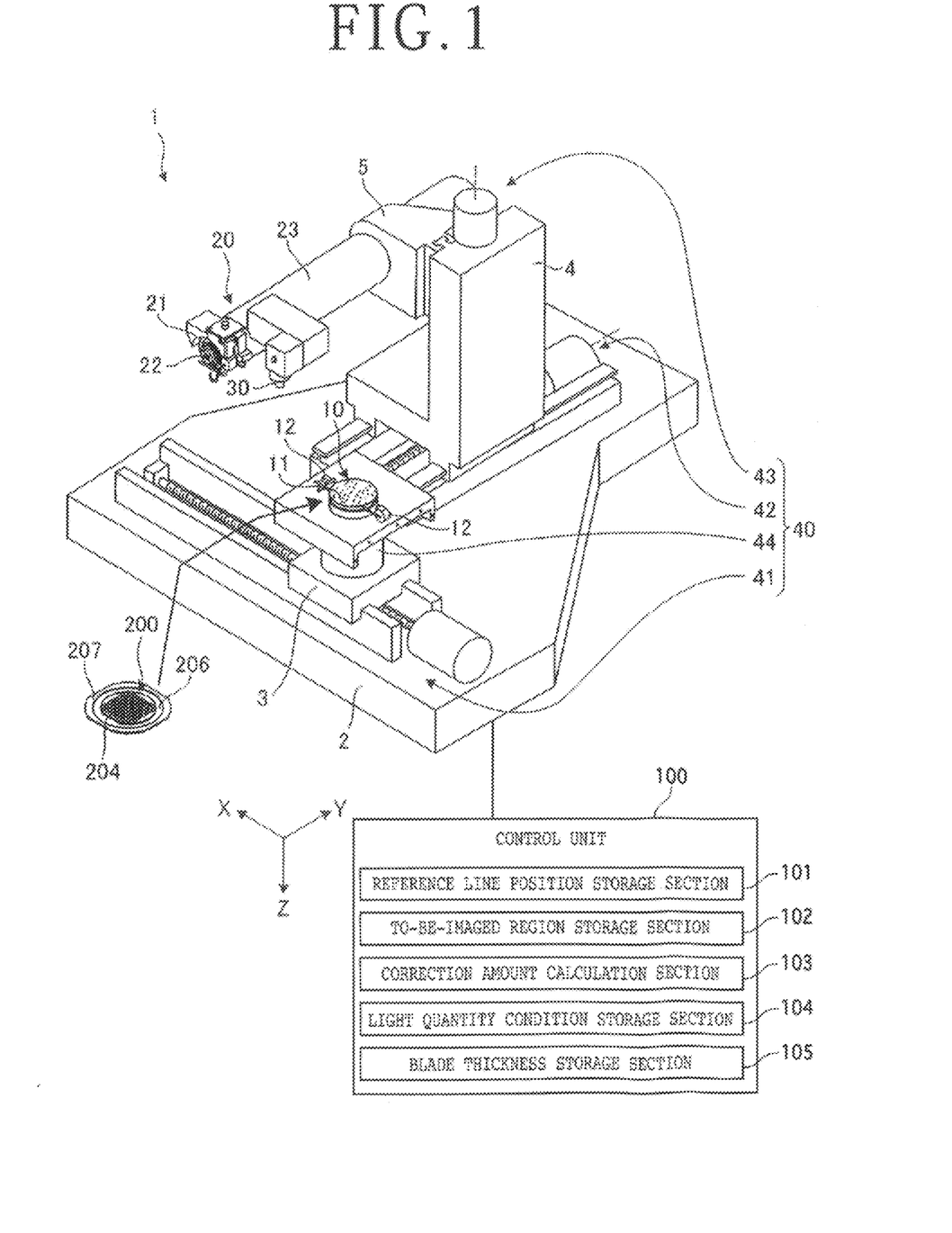
FIG. 1 is a perspective view depicting a configuration example of a cutting machine for performing a recognition method of a kerf (hereinafter called "the kerf recognition method" for the sake of simplicity) according an embodiment.
Figure 2:
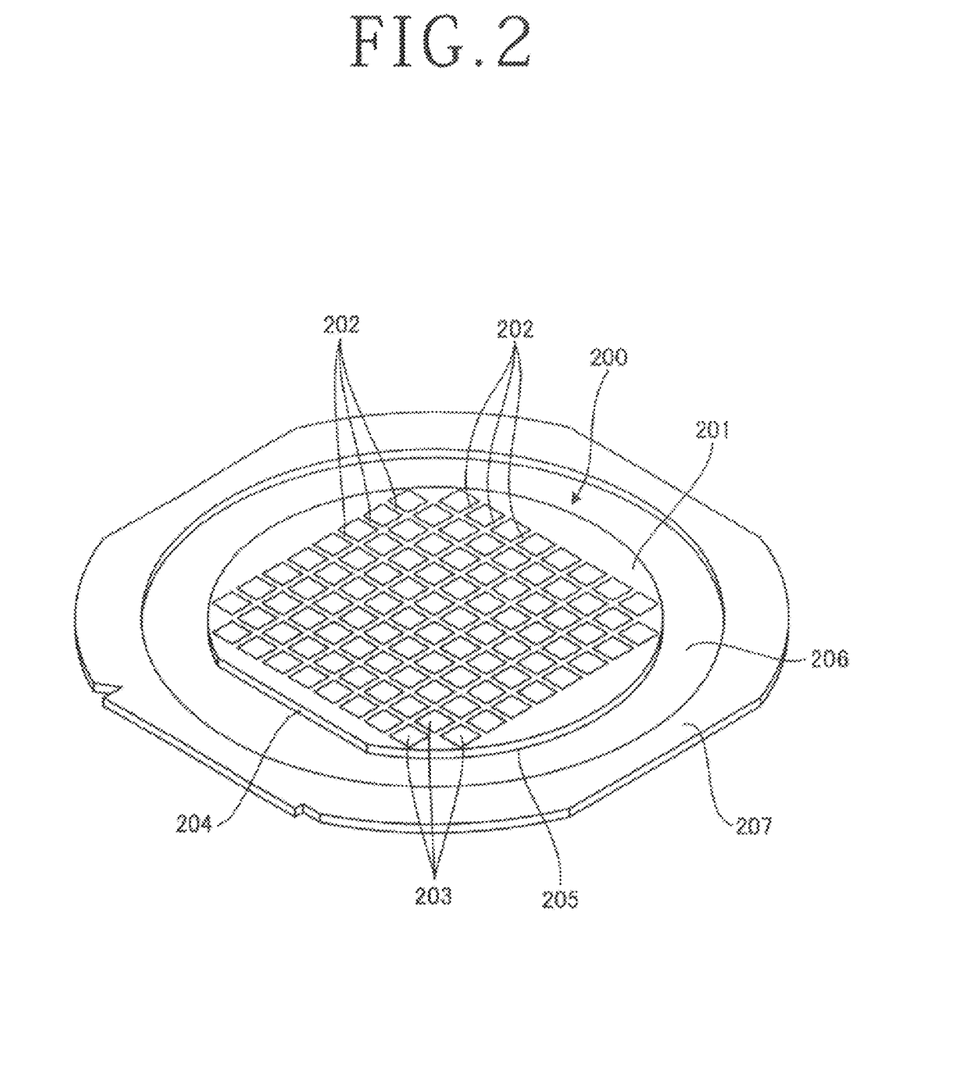
FIG. 2 is a perspective view depicting a workpiece to be machined by the cutting machine depicted in FIG. 1.

The kerf recognition method according to the embodiment of the present invention will be described based on the drawings. The kerf recognition method according to the embodiment is performed by a cutting machine 1 depicted in FIG. 1. The cutting machine 1 depicted in FIG. 1 is used to cut a workpiece 200 depicted in FIG. 2. In this embodiment, the workpiece 200 is a wafer such as a disk-shaped semiconductor wafer or an optical device wafer made of a base material such as silicon, sapphire, or gallium. As depicted in FIG. 2, the workpiece 200 includes, on a front side 201 thereof, devices 203 formed in regions defined in a lattice pattern by a plurality of planned dividing lines (streets) 202 that are also formed in the lattice pattern. In this embodiment, an orientation flat 204 is also formed on the workpiece 200 to indicate a crystal orientation.

The workpiece 200 to which the kerf recognition method of this embodiment is applied may be a so-called "TAIKO" (registered trademark) wafer that is thinned at a central portion thereof and has a ring-shaped thick portion at an outer peripheral portion thereof, or instead of such a wafer, may be a rectangular package substrate, ceramic plate, glass plate, or the like that is sealed with a resin and includes a plurality of devices. A disk-shaped dicing tape 206, which is greater in size than the workpiece 200, is bonded to a back side 205 of the workpiece 200. A ring-shaped frame 207, which centrally defines an opening and has an inner diameter greater than an outer diameter of the workpiece 200, is bonded to an outer peripheral edge of the dicing tape 206. The workpiece 200 is supported on the ring-shaped frame 207 via the dicing tape 206, and is subjected to cutting by the cutting machine 1.

The cutting machine 1 depicted in FIG. 1 holds the workpiece 200 by a chuck table 10, and cuts the workpiece 200 by a cutting blade 21 along the streets 202. As depicted in FIG. 1, the cutting machine 1 includes the chuck table 10, a cutting unit 20, an imaging unit 30, and a control unit 100 as control means. The chuck table 10 has a holding surface 11 that holds the workpiece 200 under suction. The cutting unit 20 is cutting means having the cutting blade 21, which cuts the workpiece 200 held by the chuck table 10, and a spindle 22 with the cutting blade 21 fixed thereon. The imaging unit 30 is imaging means that images the workpiece 200 held on the chuck table 10.

In addition, the cutting machine 1 also includes, as depicted in FIG. 1, a moving unit 40 as moving means that moves the chuck table 10 and the cutting unit 20 relative to each other. The moving unit 40 includes an X-axis moving unit 41, a Y-axis moving unit 42, a Z-axis moving unit 43, and a rotary moving unit 44. The X-axis moving unit 41 feeds the chuck table 10 for machining in an X-axis direction that is parallel to a horizontal direction. The Y-axis moving unit 42 index-feeds the cutting unit 20 in a Y-axis direction that is parallel to the horizontal direction and intersects the X-axis direction at right angles. The Z-axis moving unit 43 feeds the cutting unit 20 for cutting in a Z-axis direction that is parallel to a vertical direction intersecting both the X-axis direction and the Y-axis direction at right angles. The rotary moving unit 44 rotates the chuck table 10 about an axis that is parallel to the Z-axis direction, and is fed by the X-axis moving unit 41 together with the chuck table 10 for machining in the X-axis direction.

The chuck table 10 has a disk shape, and the holding surface 11 which holds the workpiece 200 is formed from a porous ceramic or the like. The chuck table 10 is arranged movably by the X-axis moving unit 41 and rotatably by the rotary moving unit 44. The chuck table 10 is connected to a vacuum suction source not illustrated and is suctioned by the vacuum suction source, and therefore holds the workpiece 200 under suction. Further, a plurality of clamping portions 12 are arranged around the periphery of the chuck table 10 to clamp the ring-shaped frame 207.

The cutting unit 20 includes the spindle 22 on which the cutting blade 21 is mounted to cut the workpiece 200 held by the chuck table 10. The cutting unit 20 includes the spindle 22 on which the cutting blade 21 is mounted, a spindle housing 23 which accommodates the spindle 22 rotatably about its axis, and a spindle motor not illustrated which is accommodated in the spindle housing 23 and rotates the spindle 22 about its axis. The cutting unit 20 is arranged movably in the Y-axis direction by the Y-axis moving unit 42 relative to the workpiece 200 held on the chuck table 10, and is also arranged movably in the Z-axis direction by the Z-axis moving unit 43.

The cutting unit 20 can position the cutting blade 21 at a desired position on the holding surface 11 of the chuck table 10 by the Y-axis moving unit 42 and the Z-axis moving unit 43. The cutting blade 21 is a super-thin grinding wheel having a substantially ring shape. The spindle 22 is rotated about its axis by the spindle motor, so that the cutting blade 21 is rotated to cut the workpiece 200. A common axis of the spindle 22 of the cutting unit 20 and the cutting blade 21 is set in parallel with the Y-axis direction.

The X-axis moving unit 41 is disposed on a machine main body 2, and moves a support plate 3, which supports the rotary moving unit 44 that rotates the chuck table 10 about its axis, in the X-axis direction, that is, in a machining feed direction, so that the chuck table 10 and the cutting unit 20 are relatively fed for machining along the X-axis direction. The Y-axis moving unit 42 is disposed on the machine main body 2, and moves a support column 4, which supports the cutting unit 20 and the Z-axis moving unit 43, in the Y-axis direction, that is, in an indexing feed direction, so that the chuck table 10 and the cutting unit 20 are relatively fed for indexing along the Y-axis direction. The Z-axis moving unit 43 is disposed on the support column 4, and moves a support member 5, which supports the spindle housing 23, in the Z-axis direction, that is, in a cutting feed direction, so that the chuck table 10 and the cutting unit 20 are relatively fed for cutting along the Z-axis direction.

The X-axis moving unit 41, the Y-axis moving unit 42, and the Z-axis moving unit 43 each include a known ball screw arranged rotatably about its axis, a known pulse motor that rotates the ball screw about its axis, and known guide rails supporting the chuck table 10 or the cutting unit 20 movably in the X-axis direction, the Y-axis direction, or the Z-axis direction.

The cutting machine 1 also includes an X-axis direction position detection unit not illustrated for detecting the position of the chuck table 10 in the X-axis direction, a Y-axis direction position detection unit not illustrated for detecting the position of the cutting unit 20 in the Y-axis direction, and a Z-axis direction position detection unit not illustrated for detecting the position of the cutting unit 20 in the Z-axis direction. The X-axis direction position detection unit and the Y-axis direction position detection unit can each have a linear scale parallel to the X-axis direction or the Y-axis direction and a read head. The Z-axis direction position detection unit detects the position of the cutting unit 20 in the Z-axis direction based on the number of pulses of the pulse motor. The X-axis direction position detection unit, the Y-axis direction position detection unit, and the Z-axis direction position detection unit output, to the control unit 100, the position of the chuck table 10 in the X-axis direction and the position of the cutting unit 20 in the Y-axis direction or the Z-axis direction. It is to be noted that in this embodiment, individual positions are determined by their distances from a predetermined reference position in the X-axis direction, the Y-axis direction, and the Z-axis direction.

Figure 3:
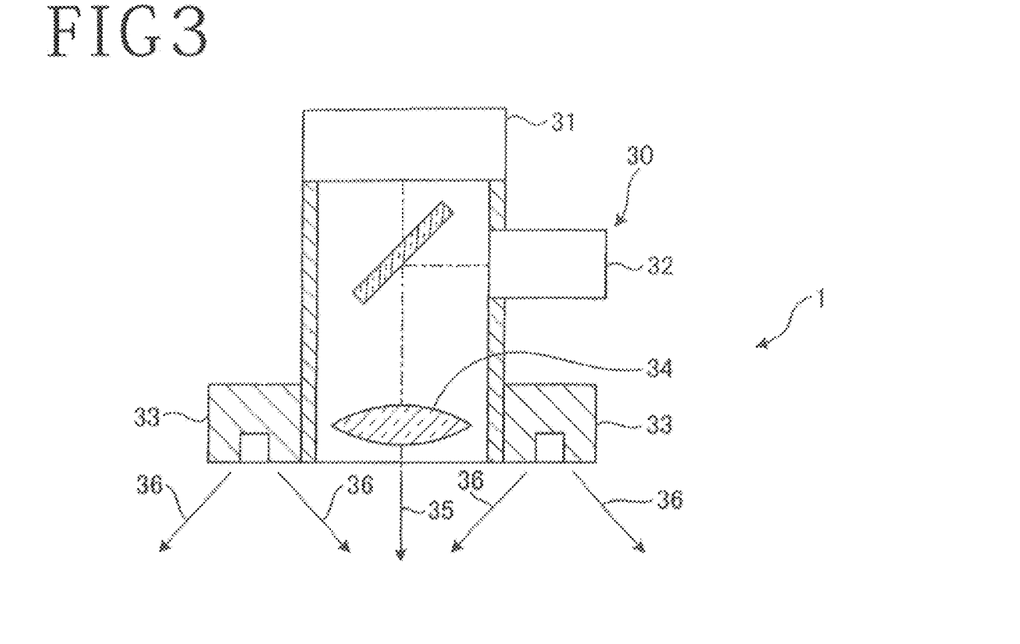
FIG. 3 is a cross-sectional view schematically illustrating a configuration of an imaging unit depicted in FIG. 1.

The imaging unit 30 is fixed on the spindle housing 23 of the cutting unit 20 such that the imaging unit 30 moves integrally with the cutting unit 20. The imaging unit 30 is disposed at a position aligned with the cutting blade 21 of the cutting unit 20 in the X-axis direction. As illustrated in FIG. 3, the imaging unit 30 includes an imaging element 31, an epi-illumination light source (also called "coaxial illumination light source") 32, and oblique illumination light sources 33. Before cutting, the imaging element 31 images a to-be-divided region of the workpiece 200 held on the chuck table 10.

The imaging element 31 is, for example, a charge-coupled device (CCD) imaging element having a plurality of pixels or a complementary metal oxide semiconductor (CMOS) imaging element. The imaging element 31 images, through a condenser lens 34, the front side 201 of the workpiece 200 held on the chuck table 10.

The epi-illumination light source 32 irradiates the front side 201 of the workpiece 200 held on the chuck table 10 with illumination light 35 through the condenser lens 34. The illumination light 35 has an optical axis which is coaxial with that of the imaging element 31. The oblique illumination light sources 33 irradiate the front side 201 of the workpiece 200 held on the chuck table 10 with illumination light 36, without passage through the condenser lens 34. The illumination light 36 has an optical axis that intersects the optical axis of the imaging element 31. The epi-illumination light source 32 and the oblique illumination light sources 33 each include, for example, a halogen light source or light emitting diodes (LEDs), and are each adjusted in light quantity by the control unit 100.

The imaging unit 30 images the workpiece 200 held on the chuck table 10 to acquire an image to be used for performing positional matching, that is, alignment between the workpiece 200 and the cutting blade 21 or for a like purpose, and outputs the acquired image to the control unit 100. It is to be noted that the epi-illumination light source 32 and the oblique illumination light sources 33 are set by the control unit 100 at light quantities sufficient to enable detection of a desired one of the streets 202 upon performing the alignment.

Figure 4:
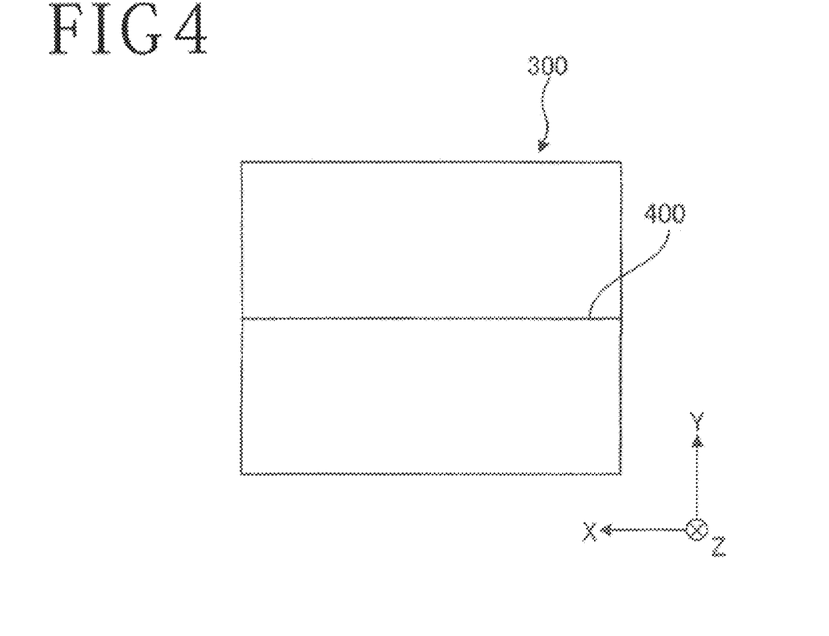
FIG. 4 is a diagram illustrating a position of a reference line in an image to be captured by the imaging unit illustrated in FIG. 3.

An image 300 captured by the imaging unit 30 and illustrated in FIG. 4 specifies intensities of light, which have been received at the individual pixels of the imaging element 31, in terms of gradation data of a plurality of levels (for example, 256 levels). Specifically, the image 300 captured by the imaging unit 30 represents contrasting intensities of light in terms of levels corresponding to the intensities of light received at the individual pixels, in other words, has contrasting densities. It is to be noted that the contrasting densities in the image 300 are omitted in FIG. 4.

In the image 300 captured by the imaging element 31 of the imaging unit 30, a reference line 400 has been set beforehand. The reference line 400 indicates a position where machining is planned. This planned position has been stored beforehand in a reference line position storage section 101 of the control unit 100 of the cutting machine 1, is formed straight in parallel with the X-axis direction, and is set at a position aligned with a thicknesswise center of the cutting blade 21 in the X-axis direction. When causing the cutting blade 21 to cut into a widthwise center of the desired street 202 upon cutting machining, the cutting machine 1 adjusts the position of the imaging unit 30 relative to the workpiece 200 such that the reference line 400 is placed at a predetermined position (for example, the center) of the desired street 202 in the widthwise direction thereof.

The control unit 100 individually controls the above-mentioned constituent components of the cutting machine 1 to make the cutting machine 1 perform a machining operation on the workpiece 200. It is to be noted that the control unit 100 is a computer including an arithmetic processing apparatus with a microprocessor like a central processing unit (CPU), a storage apparatus with a memory like a read only memory (ROM) or a random access memory (RAM), and an input/output interface apparatus. The arithmetic processing apparatus of the control unit 100 executes arithmetic processing in accordance with a computer program stored in the storage apparatus, and outputs control signals to the above-mentioned constituent components of the cutting machine 1 via the input/output interface apparatus to control the cutting machine 1.

The control unit 100 is connected to a display unit, not illustrated, adapted to display a status of a machining operation, an image, and the like and including a liquid crystal display apparatus or the like, and an input unit to be used when an operator beforehand stores information regarding machining details. The input unit includes at least one of a touch panel arranged in the display unit and an external input apparatus such as a keyboard.

The control unit 100 also specifies each position on the workpiece 200 in the Z-axis direction in terms of its distance from the holding surface 11 of the chuck table 10 in the Z-axis direction while using the holding surface 11 as a reference, and each position on the workpiece 200 in the horizontal direction in terms of its distance in the X-axis direction and its distance in the Y-axis direction from a predetermined reference position.

In this embodiment, the control unit 100 also includes the reference line position storage section 101, a to-be-imaged region storage section 102, a correction amount calculation section 103, a light quantity condition storage section 104, and a blade thickness storage section 105. The reference line position storage section 101 has beforehand stored the position of the reference line 400 in the Y-axis direction in the image 300 captured by the imaging unit 30.

After a replacement of the cutting blade 21, when the position of the cutting blade 21 in the Y-axis direction has deviated due to a rise in the temperature of the spindle 22 during cutting machining, or in a like situation, the reference line 400 and the thicknesswise center of the cutting blade 21 may deviate from each other in the Y-axis direction. The to-be-imaged region storage section 102 and the correction amount calculation section 103 calculate, as a correction amount, the deviation between the reference line 400 and the thicknesswise center of the cutting blade 21 in the Y-axis direction, and function to perform hairline alignment.

Figure 6:
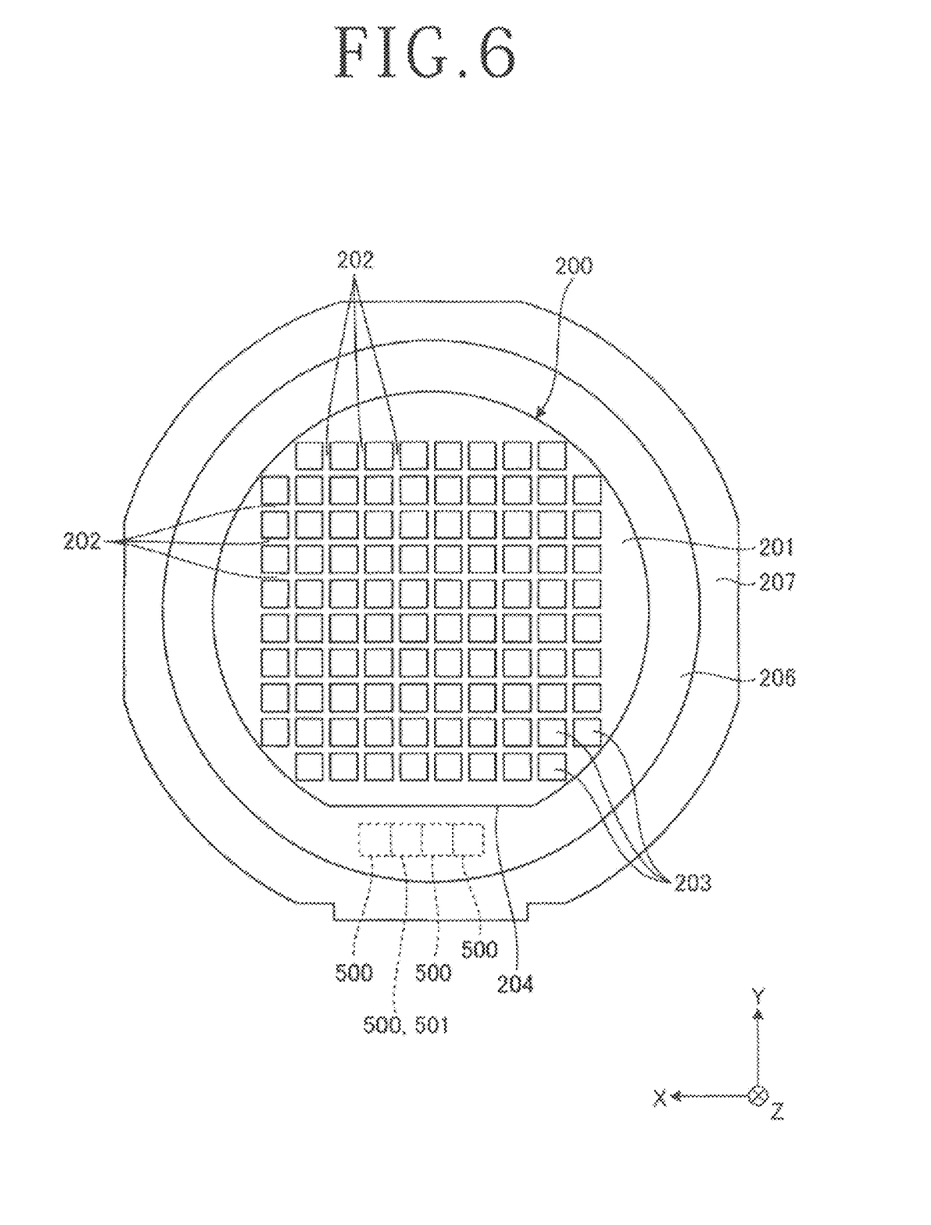
FIG. 6 is a plan view of a workpiece, illustrating a plurality of regions of a dicing tape, which are to be imaged in an optimal region determination step of the kerf recognition method illustrated in FIG. 5.

For use on calculating the correction amount, the to-be-imaged region storage section 102 has beforehand stored the positions of a plurality of regions 500 (see FIG. 6) of the dicing tape 206, which are located in a periphery of the workpiece 200 and are to be imaged by the imaging unit 30. In this embodiment, the regions 500 are arranged at positions close to one another in a vicinity of the orientation flat 204 without overlapping one another as illustrated in FIG. 6. In the present invention, however, the regions 500 are not limited to such an arrangement, but may be set as desired.

The correction amount calculation section 103 determines one of the regions 500 as an optimal region 501 (see FIG. 6) based on an image acquired by imaging with the imaging unit 30 the regions 500 the positions of which have been stored in the to-be-imaged region storage section 102, and calculates the above-mentioned correction amount based on an image 301 (see FIG. 7) acquired with the imaging unit 30 by imaging the optimal region 501 before the cutting blade 21 is caused to cut into and an image 302 (see FIG. 10) acquired with the imaging unit 30 by imaging the optimal region 501 after the cutting blade 21 is caused to cut into.

The light quantity condition storage section 104 has beforehand stored light quantity conditions indicating the respective light quantities of the epi-illumination light source 32 and the oblique illumination light sources 33 when the imaging unit 30 imaged the regions 500 the positions of which were stored in the to-be-imaged region storage section 102, and has also beforehand stored light quantity conditions indicating the respective light quantities of the epi-illumination light source 32 and the oblique illumination light sources 33 when the imaging unit 30 imaged the optimal region 501 and the correction amount calculation section 103 calculated the correction amount. In this embodiment, the light quantity condition storage section 104 has beforehand stored one of the light quantity conditions set when the imaging unit 30 imaged the regions 500 the positions of which were stored in the to-be-imaged region storage section 102, and has also beforehand stored plural kinds of light quantity conditions set when the imaging unit 30 imaged the optimal region 501 and the correction amount calculation section 103 calculated the correction amounts.

The blade thickness storage section 105 has beforehand stored a thickness of a cutting edge of the cutting blade 21 mounted on the spindle 22 of the cutting unit 20. The functions of the reference line position storage section 101, the to-be-imaged region storage section 102, the light quantity condition storage section 104, and the blade thickness storage section 105 are realized by the storage apparatus. The function of the correction amount calculation section 103 is realized when the arithmetic processing apparatus executes a computer program stored in the storage apparatus.

Figure 5:
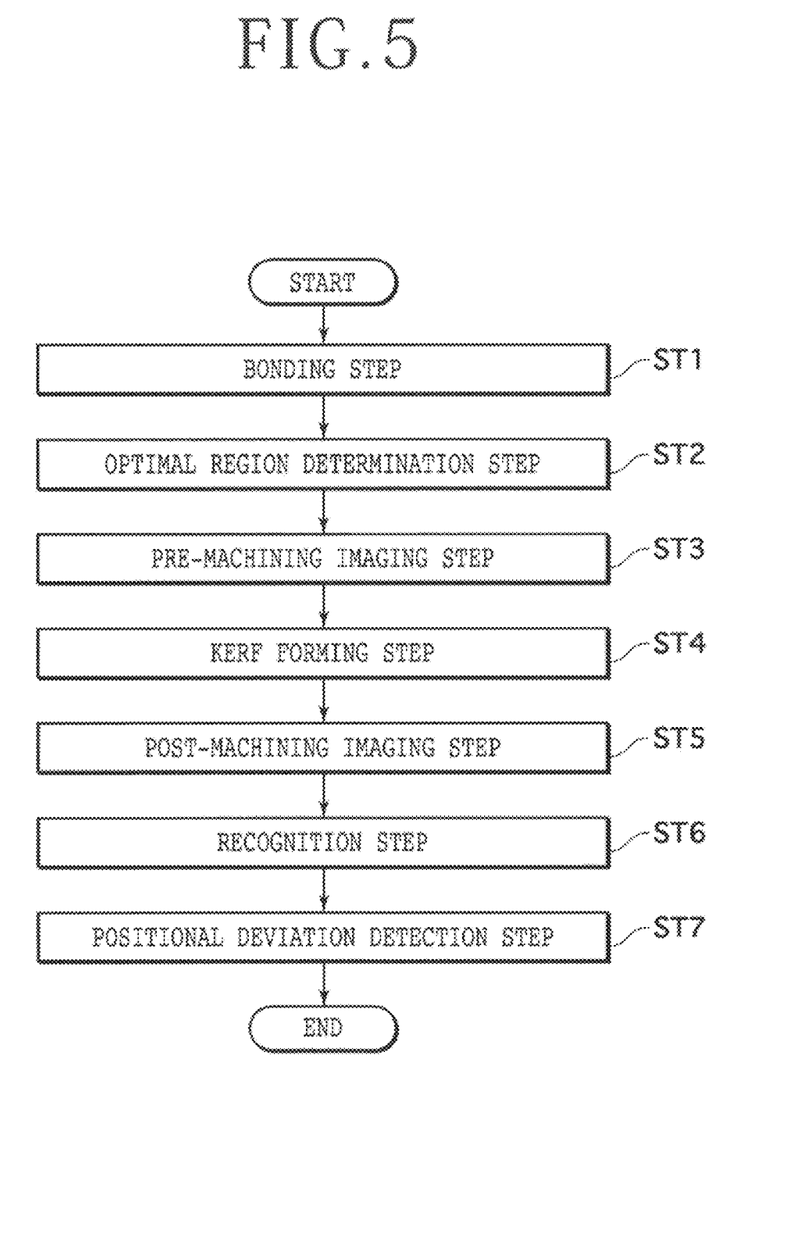
FIG. 5 is a flow chart illustrating a flow of the kerf recognition method according to the embodiment.

The kerf recognition method according to the embodiment forms a kerf 600 as a cut groove in the dicing tape 206 and recognizes the kerf 600 formed in the dicing tape 206, and also calculates the above-mentioned correction amount and performs hairline alignment. The kerf recognition method includes, as illustrated in FIG. 5, a bonding step ST1, an optimal region determination step ST2, a pre-machining imaging step ST3, a kerf forming step ST4, a post-machining imaging step ST5, a recognition step ST6, and a positional deviation detection step ST7.

(Bonding Step)

The bonding step ST1 bonds the workpiece 200 to the dicing tape 206 greater in size than the workpiece 200. In the bonding step ST1, as depicted in FIG. 2, the disk-shaped dicing tape 206 greater in size than the workpiece 200 is bonded to the back side 205 of the workpiece 200, and the ring-shaped frame 207 the inner diameter of which is greater than the outer diameter of the workpiece 200 is bonded to the outer peripheral edge of the dicing tape 206.

(Optimal Region Determination Step)

FIG. 6 is a plan view of the workpiece 200, illustrating the plurality of regions 500 of the dicing tape 206, which are to be imaged in the optimal region determination step ST2 of the kerf recognition method illustrated in FIG. 5. The optimal region determination step ST2 determines the optimal region 501 of the dicing tape 206, which is to be imaged in the pre-machining imaging step ST3.

In the optimal region determination step ST2, the operator places the workpiece 200 on the holding surface 11 of the chuck table 10 of the cutting machine 1 with the dicing tape 206 interposed between the workpiece 200 and the holding surface 11. When the control unit 100 receives an instruction to initiate hairline alignment from the operator, the workpiece 200 is held under suction on the holding surface 11 of the chuck table 10 with the dicing tape 206 interposed between the workpiece 200 and the holding surface 11, and the ring-shaped frame 207 is clamped by the clamping portions 12. In the optimal region determination step ST2, the control unit 100 controls the moving unit 40 to position the workpiece 200, which is held on the chuck table 10, below the imaging unit 30, and images the workpiece 200 by the imaging unit 30.

In the optimal region determination step ST2, the correction amount calculation section 103 of the control unit 100 calculates the position of the reference position of the workpiece 200 relative to the chuck table 10 based on the image captured by the imaging unit 30. In the optimal region determination step ST2, the correction amount calculation section 103 of the control unit 100 acquires the positions of the regions 500 (see FIG. 6) of the dicing tape 206, and also acquires the light quantity condition stored in the light quantity condition storage section 104. The regions 500 are located in the periphery of the workpiece 200 where the workpiece 200 is not bonded, and are stored in the to-be-imaged region storage section 102. In the optimal region determination step ST2, the correction amount calculation section 103 of the control unit 100 controls the moving unit 40 and the imaging unit 30 to image, by the imaging unit 30, the regions 500 the positions of which are stored in the to-be-imaged region storage section 102.

In the optimal region determination step ST2, the correction amount calculation section 103 of the control unit 100 calculates dispersion of intensities of light received at the individual pixels in each of images of the individual regions 500 as captured by the imaging unit 30. In the optimal region determination step ST2, the correction amount calculation section 103 of the control unit 100 determines, as the optimal region 501, one of the individual regions 500 where, among the images of the individual regions 500 captured by the imaging unit 30, the image with smallest dispersion of intensities of light received at the individual pixels has been captured.

(Pre-Machining Imaging Step)

Figure 7:
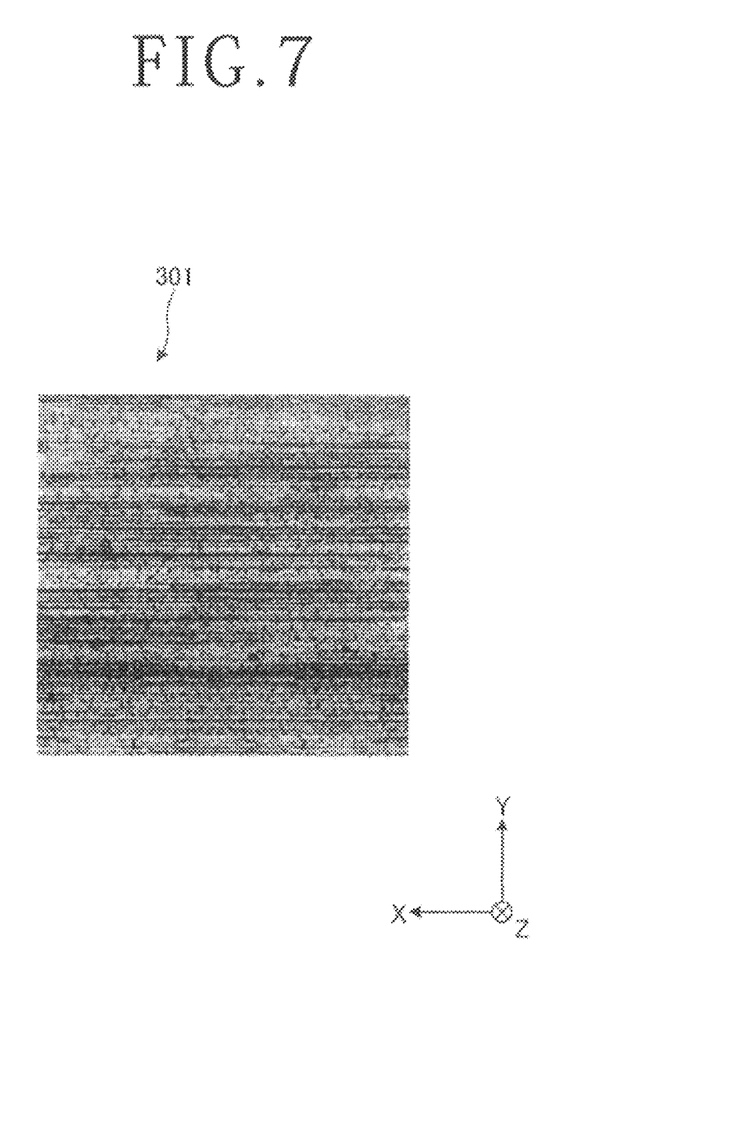
FIG. 7 is a diagram presenting one example of images captured in a pre-machining imaging step of the kerf recognition method illustrated in FIG. 5.
Figure 8:
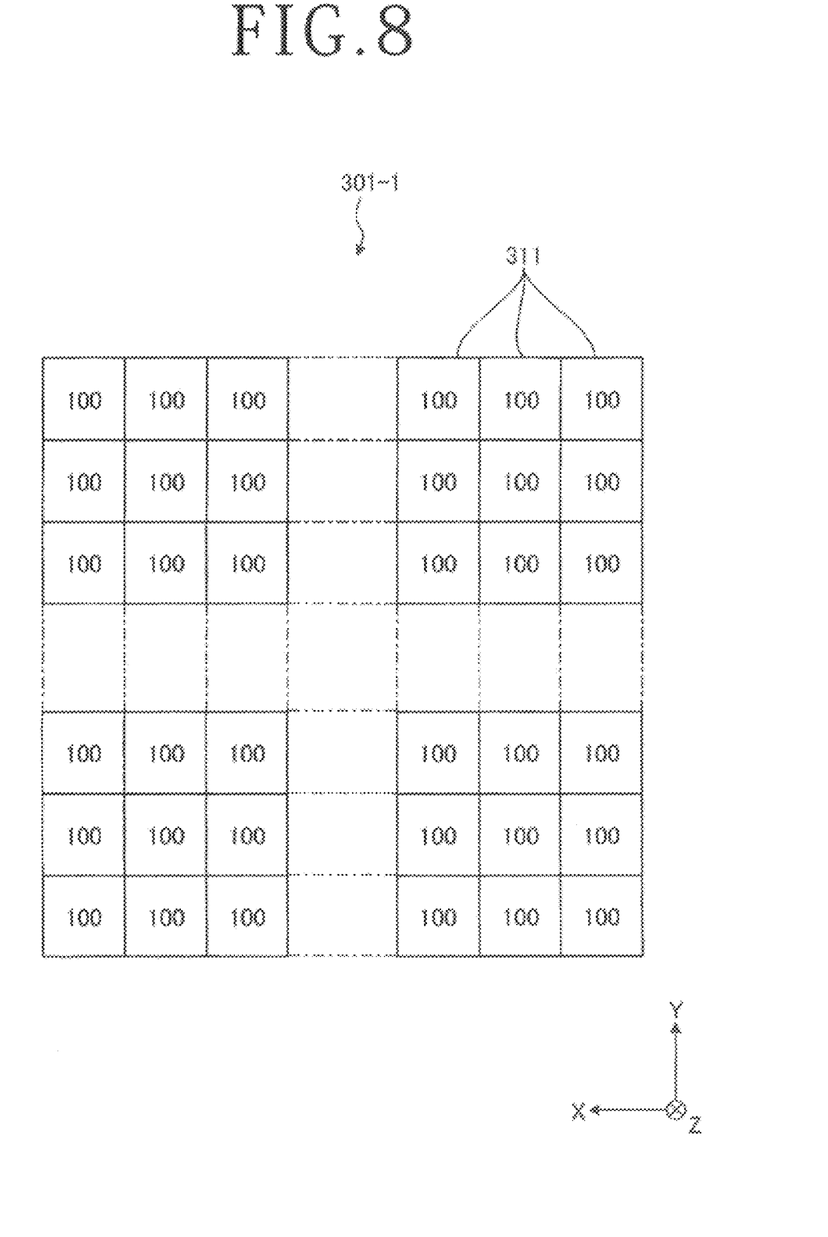
FIG. 8 is a diagram schematically illustrating levels of intensities of light received at individual pixels in the image presented in FIG. 7.

FIG. 7 is a diagram presenting one example 301 of images captured in the pre-machining imaging step ST3 of the kerf recognition method as illustrated in FIG. 5. FIG. 8 is a diagram (hereinafter referred to as an "image 301-1") schematically illustrating the levels of intensities of light received at the individual pixels 311 in the image 301 presented in FIG. 7. The pre-machining imaging step ST3 images the optimal region 501 of the dicing tape 206 where the workpiece 200 is not bonded.

In the pre-machining imaging step ST3, the correction amount calculation section 103 of the control unit 100 acquires the light quantity conditions that are stored in the light quantity condition storage section 104 and are to be used when imaging the optimal region 501, controls the moving unit 40 and the imaging unit 30 to image the optimal region 501 under the respective light quantity conditions and to acquire images one example of which is presented as the image 301 in FIG. 7, and stores the image 301 in the storage apparatus. In this manner, the pre-machining imaging step ST3 is performed under the plural kinds of light quantity conditions in this embodiment. In this embodiment, the image 301 specifies the intensity of light at each pixel 311 (see FIG. 8) to one of the levels of the above-mentioned gradation data. The intensities of light which the respective pixels 311 have received from the dicing tape 206 are relatively strong, and therefore the dicing tape 206 looks whitish.

(Kerf Forming Step)

Figure 9:
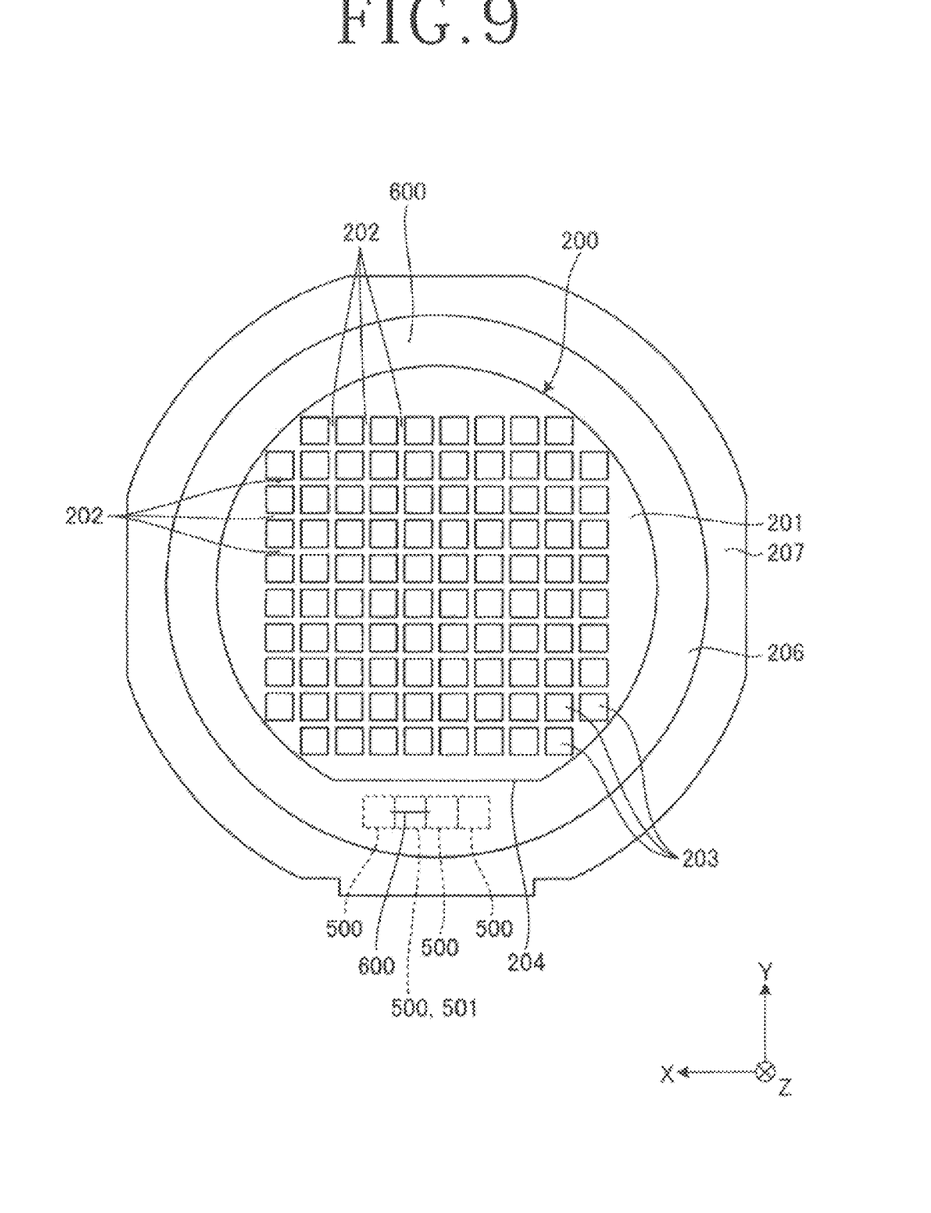
FIG. 9 is a plan view of the workpiece with a kerf formed in an optimal region of the dicing tape in a kerf forming step of the kerf recognition method illustrated in FIG. 5.

FIG. 9 is a plan view of the workpiece 200 with the kerf 600 formed in the optimal region 501 of the dicing tape 206 in the kerf forming step ST4 of the kerf recognition method as illustrated in FIG. 5. The optimal region determination step ST2 determines the optimal region 501 of the dicing tape 206, which is to be imaged in the pre-machining imaging step ST3.

In the kerf forming step ST4, the correction amount calculation section 103 of the control unit 100 controls the X-axis moving unit 41 to move the chuck table 10 in the X-axis direction, so that the cutting edge of the cutting blade 21 rotated by the spindle motor is positioned above the reference line 400 of the image 301. In the kerf forming step ST4, the correction amount calculation section 103 of the control unit 100 controls the Z-axis moving unit 43 to once lower the cutting blade 21, so that the cutting blade 21 is caused to cut into the optimal region 501. After the kerf 600 is formed as a cut groove in the optimal region 501 of the dicing tape 206 as illustrated in FIG. 9, the cutting blade 21 is raised.

(Post-Machining Imaging Step)

Figure 10:
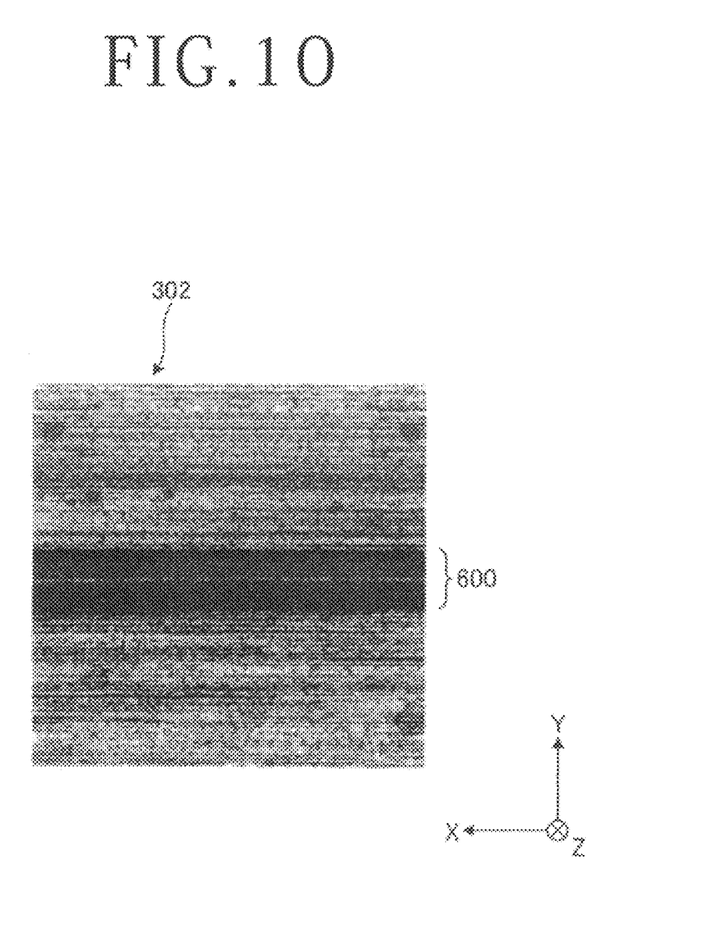
FIG. 10 is a diagram presenting one example of images captured in a post-machining imaging step of the kerf recognition method illustrated in FIG. 5.
Figure 11:
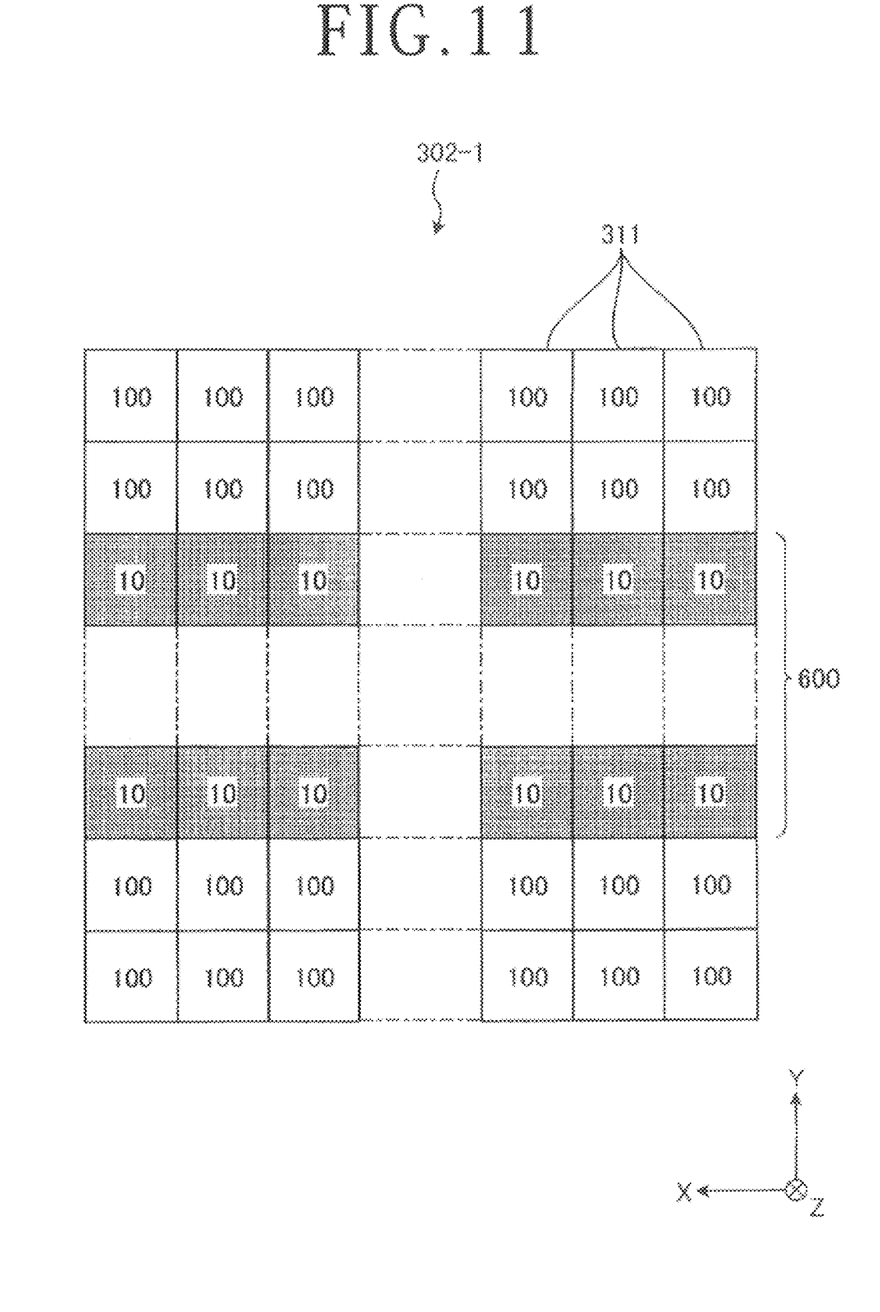
FIG. 11 is a diagram schematically illustrating the levels of intensities of light at individual pixels in the image presented in FIG. 10.

FIG. 10 is a diagram presenting one example 302 of images captured in the post-machining imaging step ST5 of the kerf recognition method as illustrated in FIG. 5. FIG. 11 is a diagram (hereinafter referred to as an "image 302-1" schematically illustrating the levels of intensities of light at the individual pixels 311 in the image 302 presented in FIG. 10. The post-machining imaging step ST5 images the optimal region 501 of the dicing tape 206 where the kerf 600 has been formed.

In the post-machining imaging step ST5, the correction amount calculation section 103 of the control unit 100 acquires the plural kinds of light quantity conditions that have been stored beforehand in the light quantity condition storage section 104 and are to be used when imaging the optimal region 501, and the correction amount calculation section 103 of the control unit 100 controls the X-axis moving unit 41 to move the chuck table 10 in the X-axis direction, so that the optimal region 501 is positioned below the imaging unit 30. In the post-machining imaging step ST5, the correction amount calculation section 103 of the control unit 100 controls the imaging unit 30 to image the optimal region 501 under the respective light quantity conditions, and images one example 302 of which is presented in FIG. 10 are acquired and stored in the storage apparatus. In this manner, the post-machining imaging step ST5 is performed under the plural kinds of light quantity conditions in this embodiment. In this embodiment, the image 302 specifies the intensity of light at each pixel 311 (see FIG. 11) to one of the levels of the above-mentioned gradation data. The intensities of light received by the individual pixels 311 from the kerf 600 are weaker than the intensities of light received by the individual pixels 311 from the dicing tape 206, and therefore the dicing tape 206 looks whitish while the kerf 600 looks blackish.

(Recognition Step)

Figure 12:
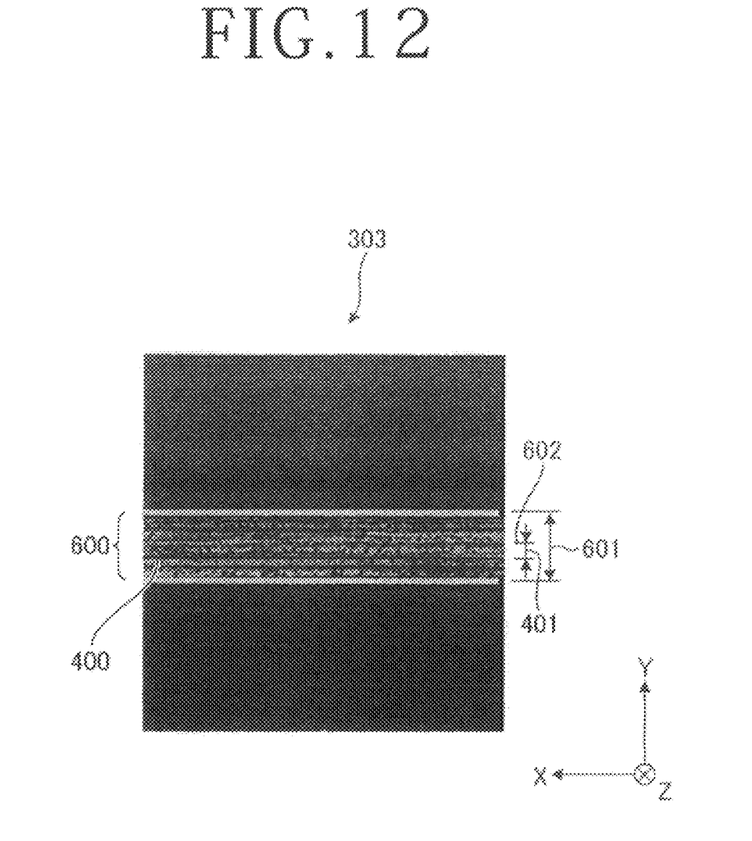
FIG. 12 is a diagram presenting an example of differential image formed in a recognition step of the kerf recognition method illustrated in FIG. 5 by determining differences in the levels of intensities of light received at corresponding individual pixels in the images.
Figure 13:
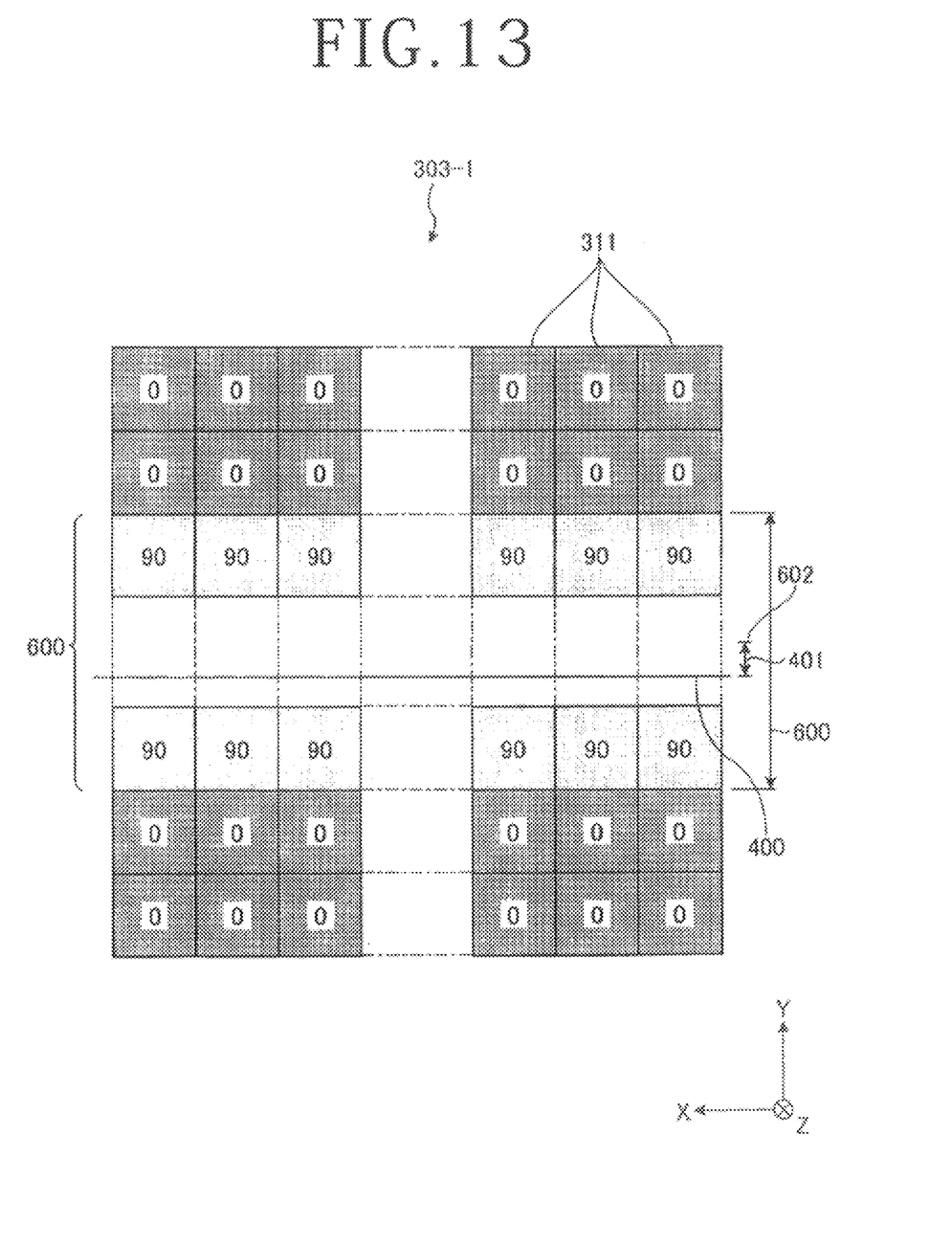
FIG. 13 is a diagram schematically illustrating the levels of intensities of light at individual pixels in a differential image between the diagram illustrated in FIG. 8 and the diagram illustrate in FIG. 11.

FIG. 12 is a diagram presenting an example 303 of differential image formed in the recognition step ST6 of the kerf recognition method as illustrated in FIG. 5 by determining differences in the levels of intensities of light received at corresponding individual pixels in the images. FIG. 13 is a diagram schematically illustrating the levels of intensities of light at individual pixels in a differential image 303-1 between the image 301-1 illustrated in FIG. 8 and the image 302-1 illustrated in FIG. 11.

The recognition step ST6 compares the images of the optimal region 501 as acquired by the pre-machining imaging step ST3 and the post-machining imaging step ST5, that is, the images 301 and 302, subtracts the same levels of the intensities of light at the corresponding pixels 311 in the images 301 and 302, and recognizes, as the kerf 600, the remaining pixels 311, that is, the regions in each of which the difference between the levels of intensities of light as obtained by the subtraction is equal to or greater than a predetermined value.

In the recognition step ST6, the correction amount calculation section 103 of the control unit 100 acquires the plurality of images 301 and 302 stored in the storage apparatus, and the images 301 and 302 captured under the same light quantity condition are correlated to each other. In the recognition step ST6, the correction amount calculation section 103 of the control unit 100 calculates differences between the levels of intensities of light received at the corresponding pixels 311 in the images 301 and 302 captured under the same light quantity condition, and forms the differential image 303 presented in FIG. 12. In the recognition step ST6, the correction amount calculation section 103 of the control unit 100 recognizes, as the kerf 600, the remaining pixels 311, that is, the regions in each of which the difference between the levels of intensities of light in the differential image 303 is equal to or greater than a predetermined value.

Described specifically, the levels of intensities of light at the individual pixels 311, which have received light from the dicing tape 206 in the image 301 presented in FIG. 7 and the image 302 presented in FIG. 10, are assumed to be level "100" in the above-mentioned gradation data as in the images 301-1 and 302-1 illustrated in FIGS. 8 and 11. On the other hand, the levels of intensities of light at the individual pixels 311, which have received light from the kerf 600 in the image 302 presented in FIG. 10, are assumed, for example, to be level "10" in the above-mentioned gradation data as in the image 302-1 illustrated in FIG. 11. In the recognition step ST6, the differences in the levels of intensities of light at corresponding individual pixels 311 in the image 301-1 illustrated in FIG. 8 and the image 302-1 illustrated in FIG. 11 are calculated, and the differential image 303-1 illustrated in FIG. 13 is formed.

In the differential image 303-1 illustrated in FIG. 13, the difference between the levels of intensities of light at each two corresponding pixels 311, which have received the light from the dicing tape 206 in both of the images 301 and 302 is "0," while the difference between the levels of intensities of light at each two corresponding pixels 311, which have received the light from the kerf 600 in both of the images 301 and 302 is "90." In the differential image 303 presented in FIG. 12, the difference between the levels of intensities of light at each two corresponding pixels 311, which have received the light from the dicing tape 206 in both of the images 301 and 302 is "0" or a very small value close to "0," while the difference between the levels of intensities of light at each two corresponding pixels 311, which have received the light from the kerf 600 in both of the images 301 and 302 is a value equal to or greater than a predetermined value.

In the recognition step ST6, the correction amount calculation section 103 of the control unit 100 therefore compares the images 301 and 302 of the optimal region 501 as acquired by the pre-machining imaging step ST3 and the post-machining imaging step ST5, and recognizes, as the kerf 600, the remaining pixels 311 at each of which the difference in the intensity of light in the differential image 303 is equal to or greater than a predetermined value. In other words, the recognition step ST6 recognizes the shape of the kerf 600 under every one of the plural kinds of light quantity conditions adopted in the pre-machining imaging step ST3 and the post-machining imaging step ST5.
(Positional Deviation Detection Step)

The positional deviation detection step ST7 detects a positional deviation 401 of the actually machined kerf 600 from the reference line 400 based on the kerf 600 in the differential image 303 recognized in the recognition step ST6. In the positional deviation detection step ST7, the correction amount calculation section 103 of the control unit 100 acquires the thickness of the cutting edge of the cutting blade 21 as stored in the blade thickness storage section 105. In the positional deviation detection step ST7, the correction amount calculation section 103 of the control unit 100 calculates widths 601 of the kerf 600 in a plurality of differential images 303 formed under the respective light quantity conditions, and selects the differential image 303 in which the calculated width 601 of the kerf 600 is closest to the thickness of the cutting edge of the cutting blade 21 as stored in the blade thickness storage section 105.

In the positional deviation detection step ST7, the correction amount calculation section 103 of the control unit 100 calculates the position of a widthwise center 602 of the kerf 600 in the Y-axis direction in the selected differential image 303, acquires the position of the reference line 400 in the Y-axis direction as stored in the reference line position storage section 101, detects, as the positional deviation 401 of the kerf 600, the distance between the position of the widthwise center 602 of the kerf 600 in the Y-axis direction and the position of the reference line 400 in the Y-axis direction in the selected differential image 303, stores the detected positional deviation 401 in the storage apparatus, and ends the kerf recognition method according to this embodiment.

In this embodiment, the positional deviation detection step ST7 therefore evaluates the shape of the kerf 600, which has been recognized from the differential image 303 formed from the images 301 and 302 captured under the respective light quantity conditions in the recognition step ST6, based on the difference, as desired evaluation standards, between the width 601 of the kerf 600 and the thickness of the cutting edge of the cutting blade 21. The evaluation of the shape of the kerf 600 is therefore conducted based on the width 601 of the kerf 600 in the differential image 303, the width 601 having a highest evaluation score and being closest to the thickness of the cutting edge of the cutting blade 21.

For enabling the cutting blade 21 to cut into the workpiece 200 at a desired position (for example, the widthwise center) of the desired street 202, the desired position being set based on the information regarding machining details, when performing cutting machining of the workpiece 200, the cutting machine 1 corrects the position of the reference line 400 at the time of alignment by using as a correction amount the positional deviation 401 stored in the storage apparatus, and then divides the workpiece 200 into the individual devices 203.

As has been described above, the kerf recognition method according to this embodiment detects the kerf 600 from the differential image 303 formed by calculating the difference between the level of the intensity of light received at each pixel 311 in the image 301 captured in the pre-machining imaging step ST3 and the level of the intensity of light received at the corresponding pixel 311 in the image 302 captured in the post-machining imaging step ST5. Therefore, the kerf recognition method according to this embodiment can eliminate effects of a pattern on the dicing tape 206, and hence facilitates accurate recognition of the kerf 600 only. As a consequence, the kerf recognition method according to this embodiment exhibits an advantageous effect that the kerf 600 formed on the dicing tape 206 can be recognized with ease.

Further, the kerf recognition method according to this embodiment, in the optimal region determination step ST2, images the plurality of regions 500 of the dicing tape 206, and selectively determines, as the optimal region 501 in which the kerf 600 is to be formed, one of the regions 500 from the captured image, the one region having pixels where the intensities of received light have smallest dispersion. As a consequence, the kerf 600 is formed using as the optimal region 501 the region where the dicing tape 206 does not have much pattern, and therefore the kerf recognition method can recognize the formed kerf 600 with ease.

Furthermore, the kerf recognition method according to this embodiment performs the pre-machining imaging step ST3 and the post-machining imaging step ST5 under the plural kinds of light quantity conditions, and selects one of the plural differential images 303, which have been formed from the images 301 and 302 captured under the different light quantity conditions, the one differential image 303 presenting the kerf 600 with a width closest to the thickness of the cutting edge of the cutting blade 21. As a consequence, the kerf recognition method can accurately calculate the position of the widthwise center 602 of the kerf 600, and hence can calculate the positional deviation 401 with accuracy. In the positional deviation detection step ST7, the kerf recognition method may also select a differential image 303 in which an outer edge of a region recognized as the kerf 600 in the thickness direction (the Y-axis direction) includes a high percentage of straight lines that are parallel to the X-axis direction intersecting the Y-axis direction at right angles. As an alternative, the kerf recognition method may select a differential image 303 having a greater difference in the number of pixels 311 between an outer edge of a region, which is recognized as the kerf 600, in the Y-axis direction and a region on an outer side of the first-mentioned region. As has been described above, the evaluation standards for use in the positional deviation detection step ST7 may include, but are not limited to, the difference between the thickness of the cutting edge of the cutting blade 21 as stored beforehand in the cutting machine and the width of the recognized kerf 600, the linearity of the recognized kerf 600, the definition of the widthwise edge of the recognized kerf 600, and so on.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A recognition method of a kerf, comprising:
    a bonding step of bonding a workpiece to a dicing tape greater in size than the workpiece;
    a pre-machining imaging step of imaging one of a plurality of predetermined region of the dicing tape where the workpiece is not bonded;
    a kerf forming step of forming a kerf, by a cutting machine, in a selected region of the plurality of predetermined regions imaged in the pre-machining imagining step;
    a post-machining imaging step of imaging the selected region with the kerf formed therein; and
    a recognition step of comparing intensities of light received at each two corresponding pixels in respective images of the selected region as acquired by the pre-machining imaging step and the post-machining imaging step, subtracting the each two pixels where intensities of received light are the same, and recognizing as the kerf a region formed by the remaining pixels.

2. The recognition method of a kerf according to claim 1, further comprising:
    selected region determination step of determining the selected region before the pre-machining imagining step,
    wherein the selected region determination step images the plurality of predetermined regions of the dicing tape where the workpiece is not bonded, and determines as the selected region one of the plurality of predetermined regions where the image with the least variation of light intensities among the plurality of predetermined regions received at the individuals pixels has been captured.

3. The recognition method of a kerf according to claim 1, further comprising:
    a positional deviation detecting step of detecting, based on the kerf recognized in the recognition step, a positional deviation between a position planned to be machined, which is beforehand stored in the cutting machine, and the formed kerf,
    wherein the pre-machining imaging step and the post-machining imaging step are each performed under a plurality of different light intensity conditions,
    the recognition step recognizes a shape of the kerf under every one of the plurality of different light intensity conditions adopted in the pre-machining imaging step and the post-machining imaging step, and
    the positional deviation detecting step evaluates shapes of kerfs recognized under the respective light intensity conditions in the recognition step, and detects the positional deviation based on the kerf shape.

* * * * *